(12) United States Patent
Zhang et al.

(10) Patent No.: US 10,719,153 B2
(45) Date of Patent: Jul. 21, 2020

(54) DISPLAY PANEL INCLUDING TOUCH CIRCUIT, TOUCH DETECTION METHOD THEREOF AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Shancai Zhang, Beijing (CN); Tao Ma, Beijing (CN); Shounian Chen, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 117 days.

(21) Appl. No.: 15/980,980

(22) Filed: May 16, 2018

(65) Prior Publication Data

US 2019/0121473 A1    Apr. 25, 2019

(30) Foreign Application Priority Data

Oct. 23, 2017    (CN) .......................... 2017 1 0992453

(51) Int. Cl.
*G06F 3/045* (2006.01)
*G06F 3/041* (2006.01)
(Continued)

(52) U.S. Cl.
CPC ............ *G06F 3/0412* (2013.01); *G06F 3/044* (2013.01); *G06F 3/0445* (2019.05);
(Continued)

(58) Field of Classification Search
CPC .. G06F 3/0412; G06F 3/04166; G06F 3/0445; G06F 3/0446; G06F 3/044; G06F 3/0416; H01L 27/323; H01L 27/3276
See application file for complete search history.

(56) References Cited

U.S. PATENT DOCUMENTS 9,715,303 B2    7/2017 Xu
9,728,558 B2    8/2017 Shen
(Continued)

FOREIGN PATENT DOCUMENTS

CN    102074196 A    5/2011
CN    103279237 A    9/2013
(Continued)

OTHER PUBLICATIONS

First Chinese Office Action dated Jan. 20, 2020, received for corresponding Chinese Application No. 201710992453.0, 18 pages.

*Primary Examiner* — Adam J Snyder
(74) *Attorney, Agent, or Firm* — Kinney & Lange, P.A.

(57) ABSTRACT

A display panel is provided including: an array substrate; a plurality of gate scanning signal lines and a plurality of data signal lines on the array substrate, projections of the plurality of gate scanning signal lines on the array substrate and projections of the plurality of data signal lines on the array substrate intersecting with each other; a plurality of sub-pixels arranged in an array, the plurality of sub-pixels being surrounded by the plurality of gate scanning signal lines and the plurality of data signal lines; touch sensing signal lines; and touch circuits. At least a part of the gate scanning signal lines are multiplexed to charge the touch circuits, and each of the touch sensing signal lines is configured to sense a change in an electrical signal of one of the touch circuits which have been charged so as to determine a position of a touch point.

15 Claims, 8 Drawing Sheets

(51) Int. Cl.
 *G06F 3/044* (2006.01)
 *H01L 27/32* (2006.01)

(52) U.S. Cl.
 CPC ........ *G06F 3/0446* (2019.05); *G06F 3/04166* (2019.05); *G06F 3/0416* (2013.01); *G06F 2203/04103* (2013.01); *H01L 27/323* (2013.01); *H01L 27/3276* (2013.01)

(56) References Cited

U.S. PATENT DOCUMENTS

| | | | |
|---|---|---|---|
| 10,437,363 B2 | 10/2019 | Ma et al. | |
| 2009/0109359 A1* | 4/2009 | Shih | G06F 3/0412 349/38 |
| 2009/0115741 A1* | 5/2009 | Wang | G06F 3/0414 345/173 |
| 2009/0273579 A1 | 11/2009 | Zachut et al. | |
| 2011/0310036 A1* | 12/2011 | Juan | G06F 3/0412 345/173 |
| 2013/0265244 A1* | 10/2013 | Kim | G06F 3/044 345/173 |
| 2014/0139489 A1* | 5/2014 | Hwang | G06F 3/042 345/175 |
| 2015/0378470 A1* | 12/2015 | Yang | G06F 3/044 345/174 |
| 2016/0253014 A1* | 9/2016 | Yang | G06F 3/044 345/174 |
| 2016/0274719 A1* | 9/2016 | Yang | G06F 3/042 |
| 2016/0291743 A1* | 10/2016 | Yang | G06F 3/0421 |
| 2017/0139519 A1* | 5/2017 | Xu | G06F 3/0414 |
| 2018/0130844 A1* | 5/2018 | Choo | H01L 27/1255 |

FOREIGN PATENT DOCUMENTS

| | | |
|---|---|---|
| CN | 103454800 A | 12/2013 |
| CN | 103792746 A | 5/2014 |
| CN | 105094486 A | 11/2015 |

* cited by examiner

DISPLAY PANEL INCLUDING TOUCH CIRCUIT, TOUCH DETECTION METHOD THEREOF AND DISPLAY DEVICE

CROSS-REFERENCE TO RELATED APPLICATION

This application claims the priority benefit of the Chinese Patent Application No. 201710992453.0 filed on Oct. 23, 2017 in the State Intellectual Property Office of China, the whole disclosure of which is incorporated herein by reference.

BACKGROUND

Technical Field

The present disclosure relates to the field of touch display technology, and in particular, to a display panel, a touch detection method and a display device.

Description of the Related Art

With the popularity of the Internet and the continuous development of display technology, the provision of display panels with touch functions has become an important feature of many electronic consumer products. A conventional display panel with a touch function usually uses an external touch screen. Specifically, the touch screen is manufactured separately from the display panel and then bonded with the display panel to form a display panel with a touch function.

SUMMARY

In an aspect, a display panel is provided including: an array substrate; a plurality of gate scanning signal lines and a plurality of data signal lines on the array substrate, projections of the plurality of gate scanning signal lines on the array substrate and projections of the plurality of data signal lines on the array substrate intersecting with each other; a plurality of sub-pixels arranged in an array, the plurality of sub-pixels being surrounded by respective gate scanning signal lines and respective data signal lines; a plurality of touch sensing signal lines; and touch circuits. At least a part of the gate scanning signal lines are multiplexed to charge the touch circuits, and each of the plurality of the touch sensing signal lines is configured to sense a change in an electrical signal of one of the touch circuits which have been charged so as to determine a position of a touch point.

For example, each of the touch circuits includes a first switch transistor and a capacitor; and a gate electrode and a source electrode of the first switch transistor are both connected to one of the gate scanning signal lines which are multiplexed to charge the touch circuits, a drain electrode of the first switch transistor is connected to one end of the capacitor, and the other end of the capacitor is connected to one of the touch sensing signal lines.

For example, the capacitor includes: a touch driving electrode connected to the drain electrode of the first switch transistor, and a touch sensing electrode connected to the one of the touch sensing signal lines.

For example, the gate scanning signal lines are located in a first layer on the array substrate, the touch sensing signal lines are located in a second layer on the array substrate, and the display panel further includes an insulating layer between the first layer and the second layer. For example, each of the gate scanning signal lines which are multiplexed to charge the touch circuits includes a first section, and an orthogonal projection of the first section on the array substrate is located within an overlapping region where orthogonal projections of the gate scanning signal lines on the array substrate are overlapped with orthogonal projections of the touch sensing signal lines on the array substrate; each of the touch sensing signal lines includes a third section, and an orthogonal projection of the third section on the array substrate is located within the overlapping region; and the capacitor includes: the first section of each of the gate scanning signal lines which are multiplexed to charge the touch circuits, and the third section of each of the touch sensing signal lines.

For example, each of the gate scanning signal lines which are multiplexed to charge the touch circuits further includes a second section, an orthogonal projection of the second section on the array substrate is located within a non-overlapping region where orthogonal projections of the gate scanning signal lines on the array substrate are not overlapped with orthogonal projections of the touch sensing signal lines on the array substrate; each of the touch sensing signal lines further includes a fourth section, and an orthogonal projection of the fourth section on the array substrate is located within the non-overlapping region. For example, a width of the first section of each of the gate scanning signal lines which are multiplexed to charge the touch circuits is greater than a width of the second section of each of the gate scanning signal lines which are multiplexed to charge the touch circuits, and/or a width of the third section of each of the touch sensing signal lines is greater than a width of the fourth section of each of the touch sensing signal lines.

For example, the first switch transistor is a P-type transistor or an N-type transistor.

For example, an extension direction of each of the touch sensing signal lines is the same as an extension direction of each of the data signal lines.

For example, each of the sub-pixels includes a pixel circuit, and the touch circuits are arranged in regions where a part of the sub-pixels are located.

For example, each of the sub-pixels includes a pixel circuit, and an orthogonal projection of each of the touch circuits on the array substrate and an orthogonal projection of the pixel circuit on the array substrate are not overlapped with each other.

For example, each of the sub-pixels includes a pixel circuit, and the pixel circuit is a pixel driving circuit for driving an OLED unit to display or a pixel driving circuit for driving a liquid crystal unit to display.

In another aspect, a display device is provided including the display panel as described above.

In a further aspect, a touch detection method for a display panel is provided including:
loading a gate scanning signal to a touch circuit through a gate scanning signal line;
detecting a change in an electrical signal of the touch circuit sensed by a touch sensing signal line; and
determining a position of a touch point where a touch action occurs, according to the change in the electrical signal of the touch circuit sensed by the touch sensing signal line.

For example, the loading a gate scanning signal to a touch circuit through a gate scanning signal line includes:
loading the gate scanning signal to the touch circuit through the gate scanning signal line while loading the gate scanning signal to a pixel circuit through the gate scanning signal line so as to turn on both a switch transistor of the touch circuit and a switch transistor of the pixel circuit.

BRIEF DESCRIPTION OF THE DRAWINGS

FIG. 3 is an enlarged schematic structural view of a dashed line portion in FIG. 2a.

DETAILED DESCRIPTION OF PREFERRED EMBODIMENTS

Specific implementations of an organic electroluminescent display panel, a touch detection method thereof and a display device provided by embodiments of the present disclosure will be described in detail with reference to accompanying drawings. It should be noted that the embodiments described herein are merely a part of the embodiments of the present disclosure, rather than all of the embodiments of the present disclosure. All other embodiments obtained by those skilled in the art based on the embodiments of the present disclosure without any creative efforts shall fall within the protection scope of the present disclosure.

Figure 1:
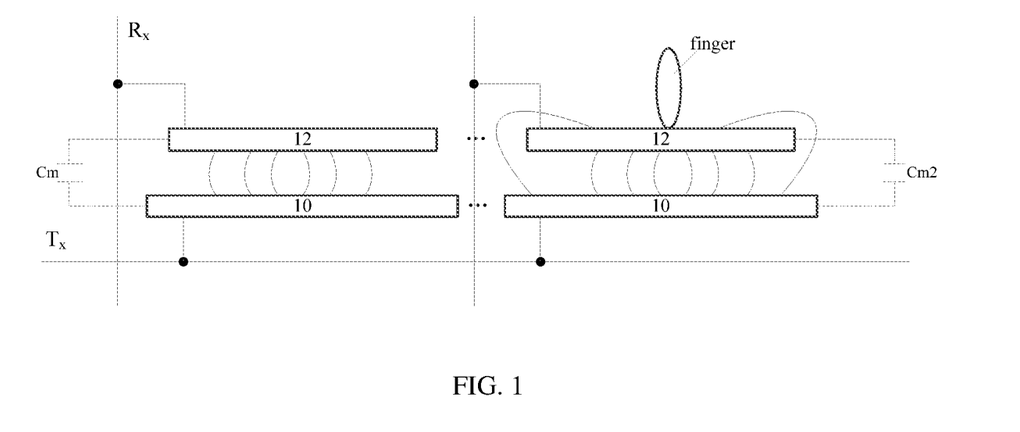
FIG. 1 is a schematic structural diagram of a mutual-capacitive touch panel.

A display panel with touch function may include a touch panel. The touch panel may include a touch driving electrode 10, a touch sensing electrode 12, a touch driving signal line $T_x$ connected to the touch driving electrode 10, and a touch sensing signal line $R_x$ connected to the touch sensing electrode 12. As an example, FIG. 1 schematically shows a structural view of a mutual-capacitive touch panel. During touch scanning, the touch driving electrode 10 is charged at a certain timing sequence so that a coupling capacitance Cm is formed between the touch driving electrode 10 and the touch sensing electrode 12. When the touch panel is touched, an original state of electric field is changed due to a finger touch, causing the coupling capacitance to change from Cm to Cm2. A position of the touch is determined by detecting the change in the coupling capacitance Cm.

As an example, the touch driving electrode 10, the touch sensing electrode 12, the touch driving signal line $T_x$ connected to the touch driving electrode 10, and the touch sensing signal line $R_x$ connected to the touch sensing electrode 12 are all embedded in an interior of the display panel. In this case, at least a layer of the touch driving signal line and a layer of the touch sensing signal line need to be added on an array substrate. Thus, it is not conducive to reducing an overall thickness of the display panel, and it also causes a need to add a new process when manufacturing the array substrate, so that production cost is increased and it is not conducive to improving production efficiency.

Figure 2A:
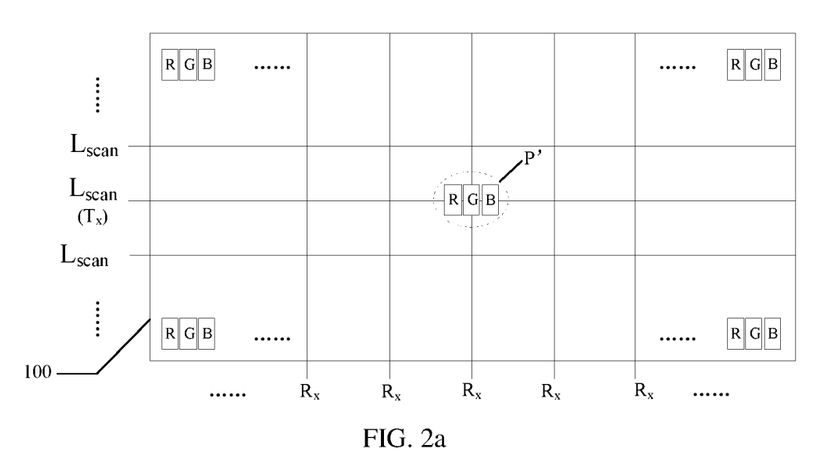
FIG. 2a and FIG. 2b are respectively schematic structural views of an organic electroluminescent display panel according to an embodiment of the present disclosure.
Figure 2B:
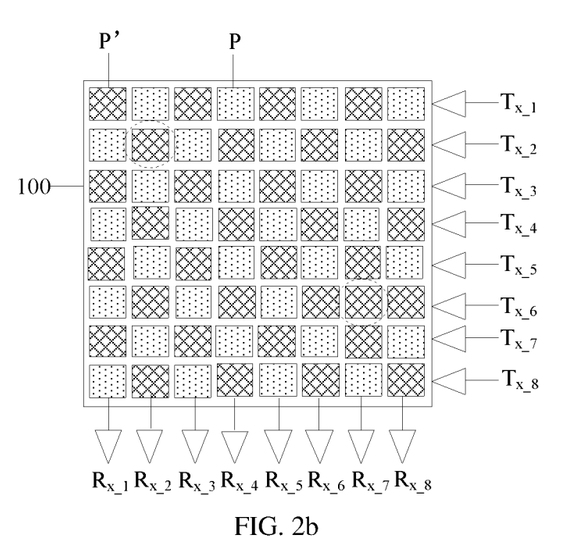
Figure 3:
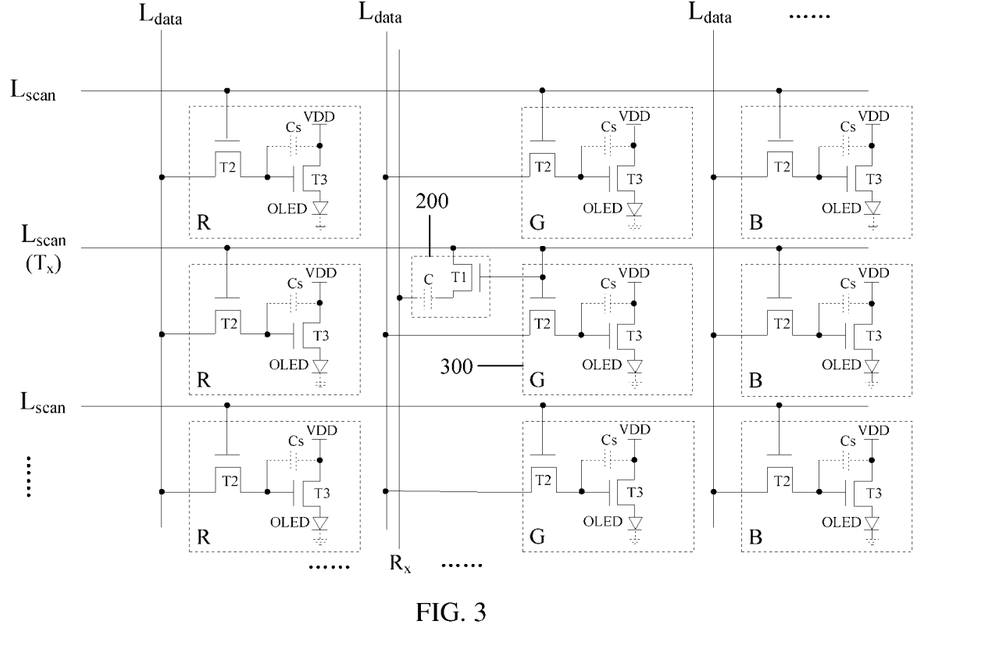

As shown in FIG. 2a, FIG. 2b and FIG. 3, an organic electroluminescent display panel (for example, an OLED display panel) according to an exemplary embodiment of the present disclosure may include: an array substrate 100; a plurality of gate scanning signal lines $L_{scan}$ on the array substrate 100; a plurality of data signal lines $L_{data}$ on the array substrate 100; a plurality of sub-pixels arranged in an array; a plurality of touch sensing signal lines $R_x$; and touch circuits 200. Projections of the plurality of gate scanning signal lines $L_{scan}$ on the array substrate 100 intersect with projections of the plurality of data signal lines $L_{data}$ on the array substrate 100. The plurality of sub-pixels are surrounded by the respective gate scanning signal lines $L_{scan}$ and the respective data signal lines $L_{data}$.

In the embodiment of the present disclosure, at least a part of the gate scanning signal lines $L_{scan}$ are multiplexed to charge the touch circuits 200. Each of the touch sensing signal lines $R_x$ is configured to sense a change in an electrical signal of one of the touch circuits 200 which have been charged to determine a position of a touch point.

In embodiments of the present disclosure, the expression "multiplex" means that the gate scanning signal line $L_{scan}$ not only provides a gate scanning signal to a pixel circuit of the display panel, but also functions as the touch driving signal line $T_x$ of the touch circuit. Specific "multiplexing" manners will be described in further detail below.

In the organic electroluminescent display panel provided by the embodiment of the present disclosure, since at least a part of the gate scanning signal lines $L_{scan}$ are multiplexed into the touch driving signal lines $T_x$, there is no need to add two new layers including the layer of the touch driving signal line $T_x$ and the layer of the touch sensing line $R_x$ on the array substrate 100 to achieve touch function. Thus, in the embodiment of the present disclosure, the touch function can be achieved only by adding one layer of the touch sensing signal line $R_x$, thereby saving the production cost and increasing the production efficiency.

As shown in FIG. 2a, FIG. 2b and FIG. 3, the organic electroluminescent display panel provided by the embodiment of the present disclosure may include sub-pixels of three colors including red (R), green (G) and blue (B). The sub-pixels of three colors together constitute a pixel P. Optionally, in order to enhance brightness of the display panel, the pixel P may further include a white (W) sub-pixel. Further, since the touch circuits 200 may be disposed in regions where a part of the sub-pixels are located, the part of the sub-pixels are different from the pixels P including only the sub-pixels of three colors including red (R), green (G) and blue (B). The pixels including both the sub-pixels of three colors including red (R), green (G) and blue (B) and the touch circuit 200 are marked as P'.

Furthermore, the density of the touch screen is usually in millimeter scale, and the density of the display screen is usually in micrometer scale. That is, as shown in FIG. 3, the number of the sub-pixels is obviously more than the number of touch structures. For example, taking an 11.6-inch FHD display as an example, the number of the sub-pixels is 1920*3*1080=6220800. However, in order to pass WIN8 or WIN10 test for an 11.6-inch FHD touch screen, it is usually sufficient to set the number of channels as follows: $T_x$=30, $R_x$=52. In this case, the number of touch structures is 30*52=1560. Therefore, in specific implementations, the number and positions of the gate scanning signal lines $L_{scan}$, which are multiplexed into the touch driving signal lines $T_x$, may be selected according to actually required touch density. In this way, the touch circuits 200 connected to the selected gate scanning signal lines $L_{scan}$ may be uniformly arranged, thereby ensuring the required touch density and touch accuracy.

In specific implementation, in the above-mentioned organic electroluminescent display panel provided by the embodiment of the present disclosure, as shown in FIG. 3, each of the touch circuits 200 may include: a first switch transistor T1 and a capacitor C. A gate electrode and a source electrode of the first switch transistor T1 are both connected to the gate scanning signal line $L_{scan}$, a drain electrode of the first switch transistor T1 is connected to one end of the capacitor C, and the other end of the capacitor C is connected to the touch sensing signal line $R_x$.

Specifically, in the above-mentioned organic electroluminescent display panel provided by the embodiment of the present disclosure, when the first switch transistor T1 is in an on state under control of the gate scanning signal line $L_{scan}$, the capacitor C is charged by the gate scanning signal line. When the first switch transistor T1 is in an off state under the control of the gate scanning signal line $L_{scan}$, a capacitance of the capacitor C remains unchanged. When a finger touches the display panel, the capacitance of the capacitor C at a position of the touch point is changed while the capacitance of the capacitors C at positions where no touch occurs remain unchanged. Therefore, by detecting a change in capacitance of the capacitor C sensed by the touch sensing line $R_x$, the position of the touch point where the touch occurs may be identified, thereby realizing the touch function.

The above descriptions are merely to illustrate specific structures of the touch circuit 200 in the organic electroluminescent display panel provided by the embodiment of the present disclosure. In specific implementations, the specific structure of the touch circuit 200 is not limited to the above structures provided by the embodiment of the disclosure. It can also be in form of other structures known by those skilled in the art. The present disclosure is not limited to the touch circuit 200.

It should be noted that, in the above-mentioned organic electroluminescent display panel provided by the embodiment of the present disclosure, the pixel circuit 300 may employ a pixel driving circuit or a pixel compensation circuit for driving the light emitting unit such as OLED unit to emit light, such as 2T1C pixel driving circuit or 6T1C pixel compensation circuit. The pixel circuit may be selected according to actual needs, which are not particularly limited.

In addition, the source electrodes and drain electrodes of the transistors in the pixel circuit 300 and the first switch transistor T1 mentioned in the above embodiments of the present disclosure may be interchangeable depending on a type of the transistor and an input signal, and are not specifically distinguished here. For example, when the transistor is a P-type transistor, the source electrode thereof is an input terminal and the drain electrode thereof is an output terminal. When the transistor is an N-type transistor, the drain electrode thereof is an input terminal and the source electrode thereof is an output terminal. The transistors in the embodiments of the present disclosure may all be P-type transistors or N-type transistors, which are not particularly limited here. In addition, the transistor mentioned in the embodiment of the present disclosure may be thin film transistors (TFTs), or metal oxide semiconductors (MOSs), which are not particularly limited here.

In a specific implementation, the capacitive touch function may be implemented by following embodiments, but not limited to the following embodiments. Specifically, one possible implementation is performed as follows. In the above-mentioned organic electroluminescent display panel provided by the embodiment of the present disclosure, the capacitor C may include: a touch driving electrode 10 connected to the drain electrode of the first switch transistor T1 and a touch sensing electrode 12 connected to the touch sensing signal line $R_x$, referring to FIG. 1 and FIG. 3.

Figure 4:
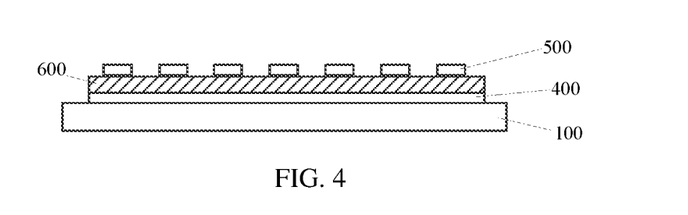
FIG. 4 is a schematic cross-sectional view of an organic electroluminescent display panel according to an embodiment of the present disclosure.

Another possible implementation is performed as follows. The above-mentioned organic electroluminescent display panel provided by the embodiment of the present disclosure may further include: an insulating layer 600 between a layer 400 where the gate scanning signal lines $L_{scan}$ are located and a layer 500 where the touch sensing signal lines $R_x$ are located, as shown in FIG. 4. A part of the gate scanning signal lines $L_{scan}$ corresponding to an overlapping region where orthogonal projections of the gate scanning signal lines $L_{scan}$ on the array substrate 100 are overlapped with orthogonal projections of the touch sensing signal lines $R_x$ on the array substrate 100 and a part of the touch sensing signal lines $R_x$ corresponding to the overlapping region constitute the capacitor C.

Referring to FIG. 4 specifically, the gate scanning signal lines are located in the first layer 400 on the array substrate 100, the touch sensing signal lines are located in the second layer 500 on the array substrate 100, and the display panel further includes the insulation layer 600 between the first layer 400 and the second layer 500.

Figure 5:
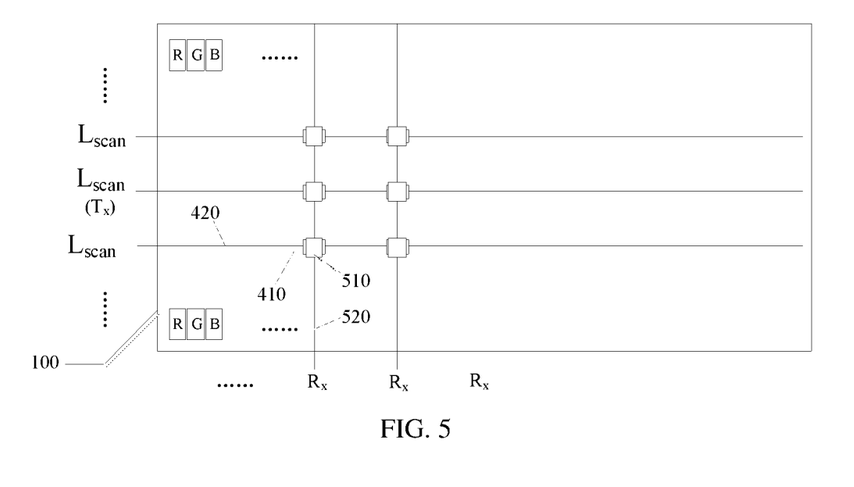
FIG. 5 is a schematic plan view of an organic electroluminescent display panel according to an embodiment of the present disclosure.

Referring to FIG. 5, each of the gate scanning signal lines $L_{scan}$ which are multiplexed to charge the touch circuits may include a first section 410 and a second section 420. An orthogonal projection of the first section 410 on the array substrate 100 is located within the overlapping region where the orthogonal projections of the gate scanning signal lines $L_{scan}$ on the array substrate 100 are overlapped with the orthogonal projections of the touch sensing signal lines $R_x$ on the array substrate 100. An orthogonal projection of the second section 420 on the array substrate 100 is located within a non-overlapping region where the orthogonal projections of the gate scanning signal lines $L_{scan}$ on the array substrate 100 are not overlapped with the orthogonal projections of the touch sensing signal lines $R_x$ on the array substrate 100.

Each of the touch sensing signal lines $R_x$ may include a third section 510 and a fourth section 520. An orthogonal projection of the third section 510 on the array substrate 100 is located within the overlapping region where the orthogonal projections of the gate scanning signal lines $L_{scan}$ on the array substrate 100 are overlapped with the orthogonal projections of the touch sensing signal lines $R_x$ on the array substrate 100. An orthogonal projection of the fourth section 520 on the array substrate 100 is located within a non-overlapping region where the orthogonal projections of the gate scanning signal lines $L_{scan}$ on the array substrate 100 are not overlapped with the orthogonal projections of the touch sensing signal lines $R_x$ on the array substrate 100.

The first section 410 of each of the gate scanning signal lines $L_{scan}$ which are multiplexed to charge the touch circuits and the third section 510 of each of the touch sensing signal lines $R_x$ constitute the capacitor C. In this embodiment, a part of the gate scanning signal line and a part of the touch sensing signal line constitute the capacitor of the touch circuit without additionally forming separate touch drive electrodes and separate touch sensing electrodes, so that a configuration of the touch circuit can be simplified.

In the illustrated embodiment, a width of the first section 410 is greater than a width of the second section 420. Additionally or alternatively, a width of the third section 510 is greater than a width of the fourth section 520. With these settings, an accuracy of touch detection can be improved.

For example, in the organic electroluminescent display panel provided by the embodiment of the present disclosure, as shown in FIG. 3, an extending direction of each of the touch sensing signal lines $R_x$ is the same as an extending direction of each of the data signal lines $L_{data}$. That is, in the specific implementation, the touch sensing signal lines $R_x$ and the data signal lines $L_{data}$ may be disposed in the same layer. In this way, it not only facilitates sensing the change in the electrical signal of the touch circuit 200, but also no new film layers may be added, thereby ensuring the production efficiency and reducing the production cost.

As an example, in the organic electroluminescent display panel provided by the embodiment of the present disclosure, an orthogonal projection of the touch circuit 200 on the array substrate 100 and an orthogonal projection of the pixel circuit 300 in the sub-pixel on the array substrate 100 are not overlapped with each other, as shown in FIG. 3. In this way, the first switch transistor T1 in the touch circuit 200 may be formed at the same time as the transistors in the pixel circuit 300 are fabricated, thereby avoiding the mask and the time required for the first switch transistor T1 to be fabricated separately, thereby reducing the production cost and improving the production efficiency.

In the organic electroluminescent display panel provided by the embodiment of the present disclosure, at least a part of the gate scanning signal lines $L_{scan}$ are multiplexed into the touch driving signal lines $T_x$. That is, in an actual operation, the at least a part of gate scanning signal lines $L_{scan}$ not only need to supply sufficient electrical power to the touch circuits 200, but also need to supply sufficient electrical power to the pixel circuits 300 in the sub-pixels. Thus, there is a high performance requirement for a gate driving chip that outputs a gate scanning signal to each of the at least a part of the gate scanning signal lines $L_{scan}$. In view of this, in the above-mentioned organic electroluminescent display panel provided by the embodiment of the present disclosure, the touch circuits 200 may be provided only in regions where a part of the sub-pixels are located, so that only a part of the gate scanning signal lines $L_{scan}$ need to charge both the touch circuit 200 and the pixel circuit 300, and the other part of the gate scanning signal lines $L_{scan}$ only need to charge the pixel circuit 300, so that the performance requirement for the gate driving chip may be appropriately reduced.

Figure 6:
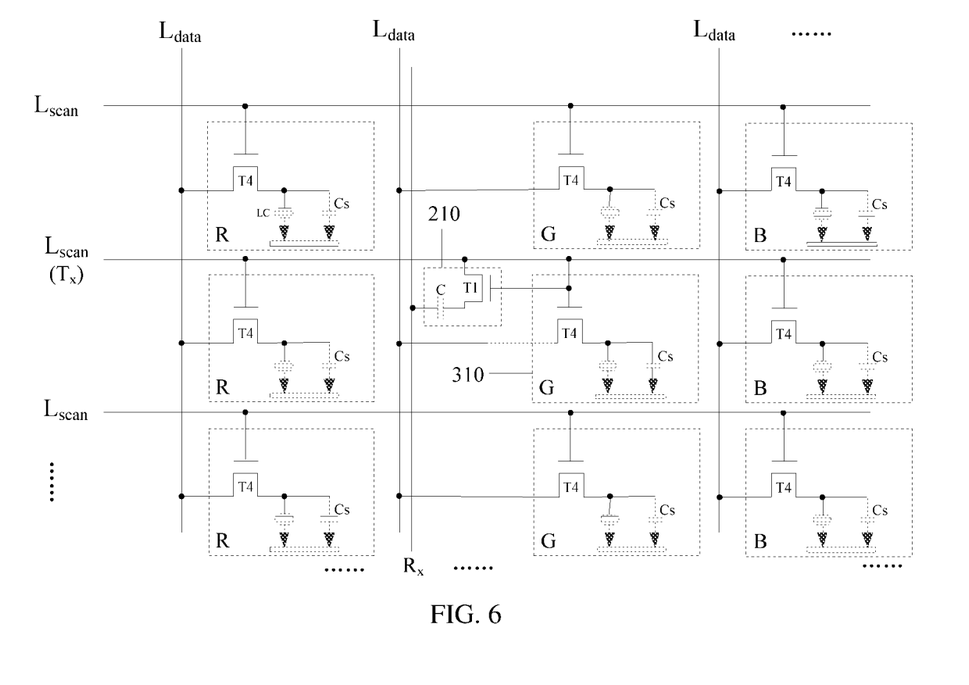
FIG. 6 is a schematic structural view of a liquid crystal display panel according to an embodiment of the present disclosure.

As shown in FIG. 6, a liquid crystal display panel according to an exemplary embodiment of the present disclosure may include: an array substrate 110; a plurality of gate scanning signal lines $L_{scan}$ on the array substrate 100; a plurality of data signal lines $L_{data}$ on the array substrate 100; a plurality of sub-pixels arranged in an array; a plurality of touch sensing signal lines $R_x$; and a touch circuit 200. Projections of the plurality of gate scanning signal lines $L_{scan}$ on the array substrate 100 intersect with projections of the plurality of data signal lines $L_{data}$ on the array substrate 100. The plurality of sub-pixels are surrounded by the respective gate scanning signal lines $L_{scan}$ and the respective data signal lines $L_{data}$.

In the embodiment of the present disclosure, at least a part of the gate scanning signal lines $L_{scan}$ are multiplexed to charge the touch circuits 200. Each of the touch sensing signal lines $R_x$ is configured to sense a change in an electrical signal of one of the touch circuits 200 which have been charged to determine a position of a touch point.

It should be noted that in the above-mentioned liquid crystal display panel provided by the embodiment of the present disclosure, the pixel circuit 300 may employ a pixel driving circuit for controlling liquid crystal to display in the related art. Specifically, the pixel circuit 300 may be selected according to actual needs, which are not described in detail here.

An embodiment of the present disclosure further provides a touch detection method of the above organic electroluminescent display panel. Since the principle of solving the problem by the touch detection method is similar to the principle of solving the problem of the organic electroluminescent display panel, an implementation of the touch detection method provided by the embodiment of the present disclosure may refer to the implementation of the above-mentioned organic electroluminescent display panel provided by the embodiments of the present disclosure, and the repeated description will be omitted.

Figure 7:
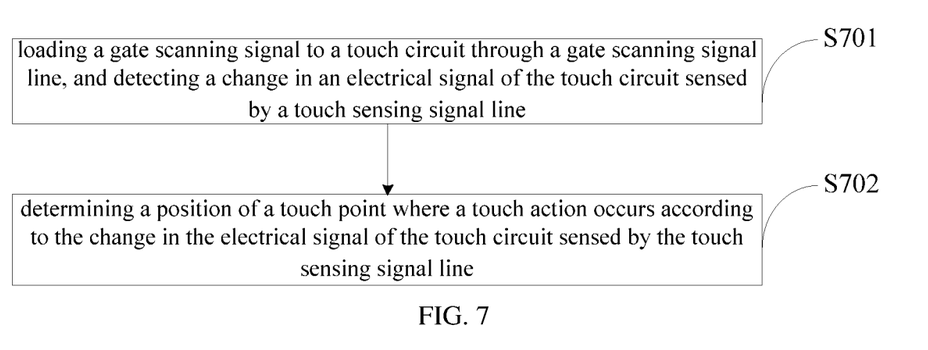
FIG. 7 is a flowchart of a touch detection method of a display panel according to an embodiment of the present disclosure.

Specifically, an embodiment of the present disclosure provides a touch detection method of an organic electroluminescent display panel, as shown in FIG. 7, the touch detection method may include steps of:

S701: loading a gate scanning signal to a touch circuit through a gate scanning signal line, and detecting a change in an electrical signal of the touch circuit sensed by a touch sensing signal line; and S702: determining a position of a touch point where a touch action occurs, according to the change in the electrical signal of the touch circuit sensed by the touch sensing signal line.

In order to better understand technical solutions of the present disclosure, a specific process of implementing the touch function and the display function of the organic electroluminescent display panel provided by the embodiment of the present disclosure will be described in detail below.

As an example, as shown in FIG. 3, the touch circuit 200 includes a first switch transistor T1 and a capacitor C. A pixel circuit 300 includes a second switch transistor T2, a driving transistor T3 and a storage capacitor $C_s$. The first switch transistor T1, the second switch transistor T2 and the driving transistor T3 are all N-type transistors that are turned on under a high level and are turned off under a low level. The pixel circuit includes a plurality of gate scanning signal lines $L_{scan}$. In the illustrated example, one gate scanning signal line $L_{scan}$ is multiplexed into a touch driving signal line $T_x$. The touch sensing signal line $R_x$ senses the change in the electrical signal of the touch circuit 200. The data signal line $L_{data}$ provides a data signal $V_{data}$ to the pixel circuit 300.

Figure 8:
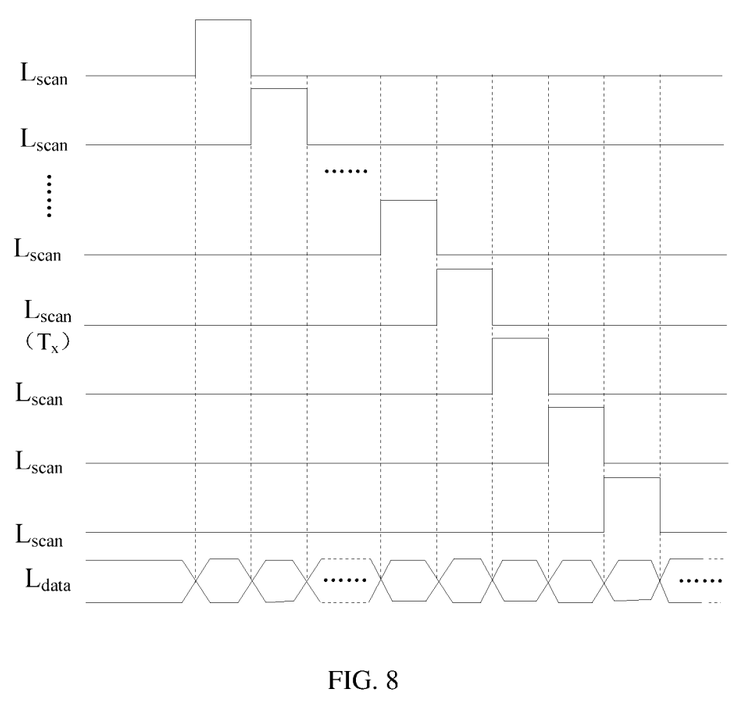
FIG. 8 is a time-sequence diagram in an operation of a display panel according to an embodiment of the present disclosure.

Specifically, as shown in FIG. 8, gate scanning signals are sequentially applied to the gate scanning signal lines $L_{scan}$, and a data signal $V_{data}$ is applied to each of the data signal lines $L_{data}$. Under control of a high level of the gate scanning signal which is outputted by the gate scanning signal line $L_{scan}$ multiplexed into the touch driving signal line $T_x$, the first switch transistor T1 and the second switch transistor T2 are both turned on. At this time, the gate scanning signal charges the capacitor C, and the data signal $V_{data}$ outputted by the data signal line $L_{data}$ charges the storage capacitor $C_s$.

Under control of a low level of the gate scanning signal which is outputted by the gate scanning signal line $L_{scan}$ multiplexed into the touch driving signal line $T_x$, the first switch transistor T1 and the second switch transistor T2 are both turned off. At this time, since the first switch transistor T1 is turned off, the capacitor C does not apply a reverse voltage to the second switch transistor T2, and a voltage stored in the storage capacitor $C_s$ is reversely applied to the driving transistor T3 to control the driving transistor T3 to generate a current. The current may drive the OLED to emit light, so as to achieve the display function.

Therefore, in the embodiment of the present disclosure, although the touch circuit 200 including the first switch transistor T1 and the capacitor C is added in the region where the sub-pixel is located, the touch circuit 200 does not affect the achievement of the display function for a picture. Moreover, it is not necessary to control the signal in the touch driving signal line $T_x$ by means of time division multiplexing to time-divisionally control the first switch transistor T1 and the second switch transistor T2. Thus, both the touch function and the display function can be achieved without using a complicated control method.

When the first switch transistor T1 is in an off state, the capacitance of the capacitor C remains unchanged. At this time, the touch sensing signal line $R_x$ may sense whether there is a change in the capacitance of the capacitor C. When no touch occurs, the capacitance of the capacitor C remains unchanged. When a finger touch occurs, a value of the change in the capacitance of the capacitor C will reach a threshold. At this time, a touch controller connected to the touch sensing signal line $R_x$ may determine a position of the touch point where the touch occurs, thereby achieving the touch function.

Figure 9:
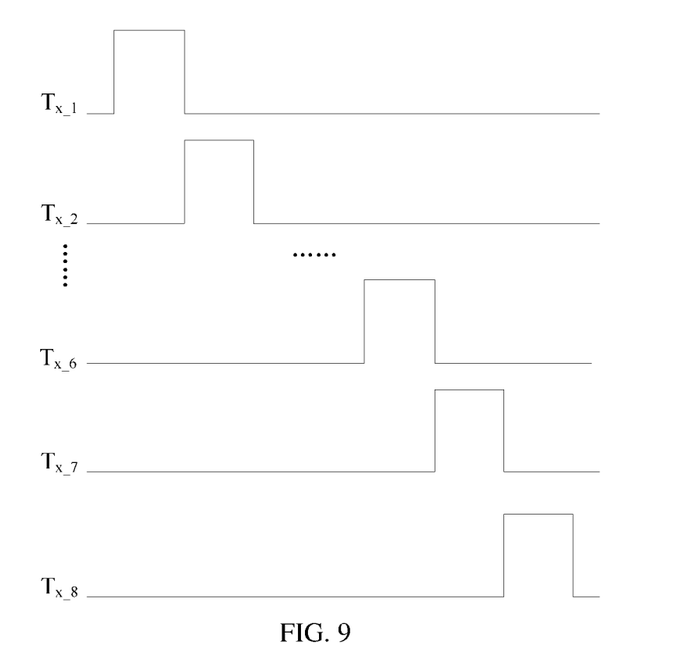
FIG. 9 is a schematic diagram showing signal loading of the gate scanning signal lines multiplexed into the touch driving signal lines in a display panel according to an embodiment of the present disclosure.
Figure 10:
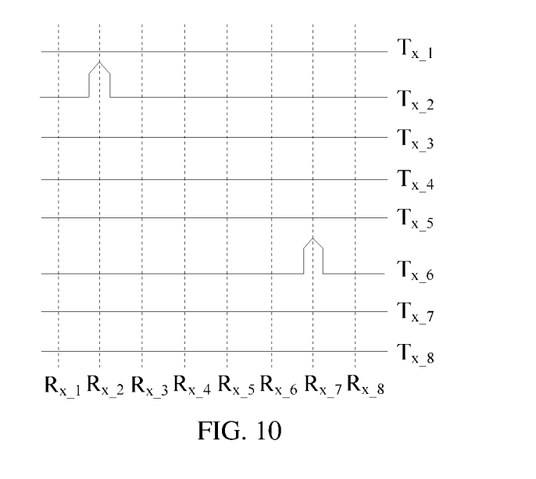
FIG. 10 is a schematic diagram showing multi-touch detection by a display panel according to an embodiment of the present disclosure.

Further, in the above-mentioned organic electroluminescent display panel provided by the embodiment of the present disclosure, a position of each of touch points can also be detected accurately when a multi-touch occurs. For example, as shown in FIG. 2b, taking an example in which the pixels in the organic electroluminescent display panel are arranged in a matrix with 8*8, and the pixels P', each of which includes the red sub-pixel R, the green sub-pixel G, the blue sub-pixel B and the touch circuit 200, are arranged in each row and each column. The gate scanning signals are sequentially applied to the touch driving signal lines $T_{x\_1}$, $T_{x\_2}$, ..., $T_{x\_8}$, as shown in FIG. 9. The changes in the electrical signals of the touch circuits 200 are sensed by the touch sensing signal lines $R_{x\_1}$, $R_{x\_2}$, ..., $R_{x\_8}$, as shown in FIG. 10. It can be seen that in FIG. 10, the second touch sensing line $R_{x\_2}$ senses the change in the electrical signal of the touch circuit 200 connected to the second touch driving line $T_{x\_2}$, and the seventh touch sensing line $R_{x\_7}$ senses the change in the electrical signal of the touch circuit 200 connected to the sixth touch driving line $T_{x\_6}$. Therefore, it is determined that touches have occurred in two dashed circles shown in FIG. 2b, that is, positions of two touch points have been identified.

A specific process of implementing the touch function and the display function of the liquid crystal display panel provided by the embodiment of the present disclosure will be described below. In the following description, only the points different from the organic electroluminescent display panel are described, and the same points as the organic electroluminescent display panel will not be described again.

As an example, as shown in FIG. 6, the touch circuit 210 includes a first switch transistor T1 and a capacitor C. A pixel circuit 310 includes a fourth switch transistor T4 and a storage capacitor $C_s$. The first switch transistor T1 and the fourth switch transistor T4 are all N-type transistors that are turned on under a high level and are turned off under a low level. The pixel circuit includes a plurality of gate scanning signal lines $L_{scan}$. In the illustrated example, one gate scanning signal line $L_{scan}$ is multiplexed into a touch driving signal line $T_x$. The touch sensing signal line $R_x$ senses the change in the electrical signal of the touch circuit 210. A data signal line $L_{data}$ provides a data signal $V_{data}$ to the pixel circuit 310.

Specifically, as shown in FIG. 8, gate scanning signals are sequentially applied to the gate scanning signal lines $L_{scan}$, and a data signal $V_{data}$ is applied to each of the data signal lines $L_{data}$. Under control of a high level of the gate scanning signal which is outputted by the gate scanning signal line $L_{scan}$ multiplexed into the touch driving signal line $T_x$, the first switch transistor T1 and the fourth switch transistor T4 are both turned on. At this time, the gate scanning signal charges the capacitor C, and the data signals $V_{data}$ outputted by the data signal lines $L_{data}$ are applied to liquid crystal pixel electrodes (labelled by "LC" in FIG. 6) and the storage capacitor $C_s$, so as to achieve the display function.

Under control of a low level of the gate scanning signal which is outputted by the gate scanning signal line $L_{scan}$ multiplexed into the touch driving signal line $T_x$, the first switch transistor T1 and the fourth switch transistor T4 are both turned off. At this time, since the first switch transistor T1 is turned off, the capacitor C does not apply a reverse voltage to the fourth switch transistor T4.

Therefore, in the embodiment of the present disclosure, although the touch circuit 210 including the first switch transistor T1 and the capacitor C is added in the region where the sub-pixel is located, the touch circuit 210 does not affect the achievement of the display function.

When the first switch transistor T1 is in an off state, the capacitance of the capacitor C remains unchanged. At this time, the touch sensing signal line $R_x$ may sense whether there is a change in the capacitance of the capacitor C. When no touch occurs, the capacitance of the capacitor C remains unchanged. When a finger touch occurs, a value of the change in the capacitance of the capacitor C will reach a threshold value. At this time, a touch controller connected to the touch sensing signal line $R_x$ may determine a position of the touch point where the touch occurs, thereby achieving the touch function.

Similar to the organic electroluminescent display panel described above, the liquid crystal display panel provided by the embodiment of the present disclosure may also realize the multi-touch function, which will not be described again.

Based on the same inventive concept, an embodiment of the present disclosure further provides a display device including the above-mentioned organic electroluminescent display panel or liquid crystal display panel provided by the embodiments of the present disclosure. The display device may include: a mobile phone, a tablet computer, a television, a display, a laptop computer, a digital camera, a navigator, a smart watch, a fitness wristband, a personal digital assistant, and other products or components that have display function. Those skilled in the art should understand that the display device may further include other essential components, which are not described herein and should not be taken as limiting the present disclosure. For an implementation of the display device, references may be made to the above embodiments of the electroluminescent display panel or the liquid crystal display panel, and the repeated description is omitted here.

In the embodiments of the present disclosure, since the gate scanning signal line is multiplexed into the touch driving signal line, there is no need to add two new layers on the array substrate to achieve the touch function. In the embodiment of the present disclosure, the touch function can be achieved only by adding one layer of the touch sensing signal line, thereby saving the production cost and increasing the production efficiency.

It should be noted that relational terms such as "first" and "second" herein are only used to distinguish one entity or operation from another entity or operation, and do not necessarily require or imply that there are any relationships or orders between these entities or operations.

It will be apparent to those skilled in the art that various modifications and variations can be made to the present disclosure without departing from the spirit and scope of the present disclosure. In this way, if these modifications and variations of the present disclosure belong to the scope of the claims of the present disclosure and their equivalent technologies, the present disclosure also intends to include these modifications and variations.

What is claimed is:

1. A display panel comprising:
    an array substrate;
    a plurality of gate scanning signal lines and a plurality of data signal lines on the array substrate, projections of the plurality of gate scanning signal lines on the array substrate and projections of the plurality of data signal lines on the array substrate intersecting with each other;
    a plurality of sub-pixels arranged in an array, the plurality of sub-pixels being surrounded by respective gate scanning signal lines and respective data signal lines;
    a plurality of touch sensing signal lines; and
    touch circuits,
    wherein at least a part of the gate scanning signal lines are multiplexed to charge the touch circuits, and each of the plurality of touch sensing signal lines is configured to sense a change in an electrical signal of one of the touch circuits which has been charged so as to determine a position of a touch point;
    wherein each of the touch circuits comprises a first switch transistor and a capacitor; and
    wherein a gate electrode and a source electrode of the first switch transistor are both connected to one of the gate scanning signal lines which are multiplexed to charge the touch circuits, a drain electrode of the first switch transistor is connected to a first end of the capacitor, and a second end of the capacitor is directly electrically connected to one of the touch sensing signal lines.

2. The display panel of claim 1, wherein the capacitor comprises: a touch driving electrode connected to the drain electrode of the first switch transistor, and a touch sensing electrode connected to the one of the touch sensing signal lines.

3. The display panel of claim 2, wherein each of the sub-pixels comprises a pixel circuit, and the touch circuits are arranged in regions where a part of the sub-pixels are located.

4. The display panel of claim 1, wherein the gate scanning signal lines are located in a first layer on the array substrate, the touch sensing signal lines are located in a second layer on the array substrate, and the display panel further comprises an insulating layer between the first layer and the second layer; and
    wherein each of the gate scanning signal lines which are multiplexed to charge the touch circuits comprises a first section, and an orthogonal projection of the first section on the array substrate is located within an overlapping region where orthogonal projections of the gate scanning signal lines on the array substrate are overlapped with orthogonal projections of the touch sensing signal lines on the array substrate; each of the touch sensing signal lines comprises a third section, and an orthogonal projection of the third section on the array substrate is located within the overlapping region; and
    wherein the capacitor comprises: the first section of each of the gate scanning signal lines which are multiplexed to charge the touch circuits, and the third section of each of the touch sensing signal lines.

5. The display panel of claim 4, wherein each of the gate scanning signal lines which are multiplexed to charge the touch circuits further comprises a second section, an orthogonal projection of the second section on the array substrate is located within a non-overlapping region where orthogonal projections of the gate scanning signal lines on the array substrate are not overlapped with orthogonal projections of the touch sensing signal lines on the array substrate; each of the touch sensing signal lines further comprises a fourth section, and an orthogonal projection of the fourth section on the array substrate is located within the non-overlapping region; and
    wherein a width of the first section of each of the gate scanning signal lines which are multiplexed to charge the touch circuits is greater than a width of the second section of each of the gate scanning signal lines which are multiplexed to charge the touch circuits, and/or a width of the third section of each of the touch sensing signal lines is greater than a width of the fourth section of each of the touch sensing signal lines.

6. The display panel of claim 4, wherein an extension direction of each of the touch sensing signal lines is the same as an extension direction of each of the data signal lines.

7. The display panel of claim 4, wherein each of the sub-pixels comprises a pixel circuit, and the touch circuits are arranged in regions where a part of the sub-pixels are located.

8. The display panel of claim 1, wherein the first switch transistor is a P-type transistor or an N-type transistor.

9. The display panel of claim 1, wherein an extension direction of each of the touch sensing signal lines is the same as an extension direction of each of the data signal lines.

10. The display panel of claim 1, wherein each of the sub-pixels comprises a pixel circuit, and the touch circuits are arranged in regions where a part of the sub-pixels are located.

11. The display panel of claim 1, wherein each of the sub-pixels comprises a pixel circuit, and an orthogonal projection of each of the touch circuits on the array substrate and an orthogonal projection of the pixel circuit on the array substrate are not overlapped with each other.

12. The display panel of claim 1, wherein each of the sub-pixels comprises a pixel circuit, and the pixel circuit is a pixel driving circuit for driving an OLED unit to display or a pixel driving circuit for driving a liquid crystal unit to display.

13. A display device comprising the display panel of claim 1.

14. A touch detection method for a display panel comprising:
    loading a gate scanning signal to a touch circuit through a gate scanning signal line;
    detecting a change in an electrical signal of the touch circuit sensed by a touch sensing signal line; and determining a position of a touch point where a touch action occurs, according to the change in the electrical signal of the touch circuit sensed by the touch sensing signal line, wherein the touch circuit comprises a first switch transistor and a capacitor; and wherein a gate electrode and a source electrode of the first switch transistor are both connected to the gate scanning signal line, a drain electrode of the first switch transistor is connected to a first end of the capacitor, and a second end of the capacitor is directly electrically connected to the touch sensing signal line.

15. The touch detection method of claim 14, wherein loading the gate scanning signal to the touch circuit through the gate scanning signal line comprises:

loading the gate scanning signal to the touch circuit through the gate scanning signal line while loading the gate scanning signal to a pixel circuit through the gate scanning signal line so as to turn on both a switch transistor of the touch circuit and a switch transistor of the pixel circuit.

* * * * *